(12) United States Patent
Luo et al.

(10) Patent No.: US 11,319,625 B2
(45) Date of Patent: May 3, 2022

(54) PREPARATION METHOD OF MASK ASSEMBLY AND MASK ASSEMBLY

(71) Applicants: Chengdu BOE Optoelectronics Technology Co., Ltd., Sichuan (CN); BOE TECHNOLOGY GROUP CO., LTD., Beijing (CN)

(72) Inventors: Chang Luo, Beijing (CN); Xiaoyu Yang, Beijing (CN); Fengli Ji, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 11 days.

(21) Appl. No.: 17/043,083

(22) PCT Filed: Feb. 27, 2020

(86) PCT No.: PCT/CN2020/076946
§ 371 (c)(1),
(2) Date: Sep. 29, 2020

(87) PCT Pub. No.: WO2020/192349
PCT Pub. Date: Oct. 1, 2020

(65) Prior Publication Data
US 2021/0230734 A1    Jul. 29, 2021

(30) Foreign Application Priority Data

Mar. 25, 2019 (CN) .......................... 201910229501.X

(51) Int. Cl.
*H01L 21/027* (2006.01)
*C23C 14/04* (2006.01)
(Continued)

(52) U.S. Cl.
CPC ............ *C23C 14/042* (2013.01); *B23K 26/60* (2015.10); *C23C 14/24* (2013.01); *G03F 7/2063* (2013.01);
(Continued)

(58) Field of Classification Search
CPC ....... C23C 14/042; C23C 14/24; B23K 26/60; G03F 7/2063; H01L 21/027; H01L 51/0014; H01L 23/544; H01L 21/682
(Continued)

(56) References Cited

U.S. PATENT DOCUMENTS 8,273,179 B2   9/2012 Kim et al.
9,284,638 B2   3/2016 Ko et al.
(Continued)

FOREIGN PATENT DOCUMENTS

CN   1534383 A     10/2004
CN   102023474 A   4/2011
(Continued)

OTHER PUBLICATIONS

China Patent Office, First Office Action dated Mar. 18, 2020, for corresponding Chinese application 201910229501.X.

*Primary Examiner* — David Vu
*Assistant Examiner* — Brandon C Fox
(74) *Attorney, Agent, or Firm* — Houtteman Law LLC

(57) ABSTRACT

An embodiment of the present application provides a preparation method of a mask assembly, including: fixing, after stretching and aligning a blocking, the blocking on a side of a frame; opening at least one stretching align hole and at least one evaporation align mark in the fixed blocking and frame; fixing, after stretching and aligning a mask sheet, the mask sheet on a side of the blocking away from the frame (Continued)

according to the stretching align hole; and opening at least one evaporation align mark in the fixed mask sheet to obtain the mask assembly.

7 Claims, 5 Drawing Sheets

(51) Int. Cl.
| | |
|---|---|
| C23C 14/24 | (2006.01) |
| B23K 26/60 | (2014.01) |
| G03F 7/20 | (2006.01) |
| H01L 51/00 | (2006.01) |
| H01L 21/68 | (2006.01) |
| H01L 23/544 | (2006.01) |

(52) U.S. Cl.
CPC .......... *H01L 21/027* (2013.01); *H01L 21/682* (2013.01); *H01L 23/544* (2013.01); *H01L 51/0014* (2013.01)

(58) Field of Classification Search
USPC ................................. 438/401, 462
See application file for complete search history.

(56) References Cited

U.S. PATENT DOCUMENTS

| | | | |
|---|---|---|---|
| 2005/0115503 A1* | 6/2005 | Hagiwara | H01L 51/0011 |
| | | | 118/721 |
| 2016/0043319 A1 | 2/2016 | White et al. | |
| 2016/0310988 A1 | 10/2016 | Lee et al. | |
| 2018/0026189 A1 | 1/2018 | Kim | |
| 2018/0119268 A1* | 5/2018 | Kawato | C23C 14/042 |
| 2018/0209028 A1* | 7/2018 | Li | C23C 14/24 |
| 2019/0062895 A1 | 2/2019 | Zhang et al. | |
| 2019/0378984 A1 | 12/2019 | Nakamura et al. | |
| 2020/0385856 A1* | 12/2020 | Yamabuchi | C23C 14/042 |

FOREIGN PATENT DOCUMENTS

| | | |
|---|---|---|
| CN | 102110787 A | 6/2011 |
| CN | 105144421 A | 12/2015 |
| CN | 106191769 A | 12/2016 |
| CN | 107523788 A | 12/2017 |
| CN | 107653435 A | 2/2018 |
| CN | 108220885 A | 6/2018 |
| CN | 109750256 A | 5/2019 |

* cited by examiner

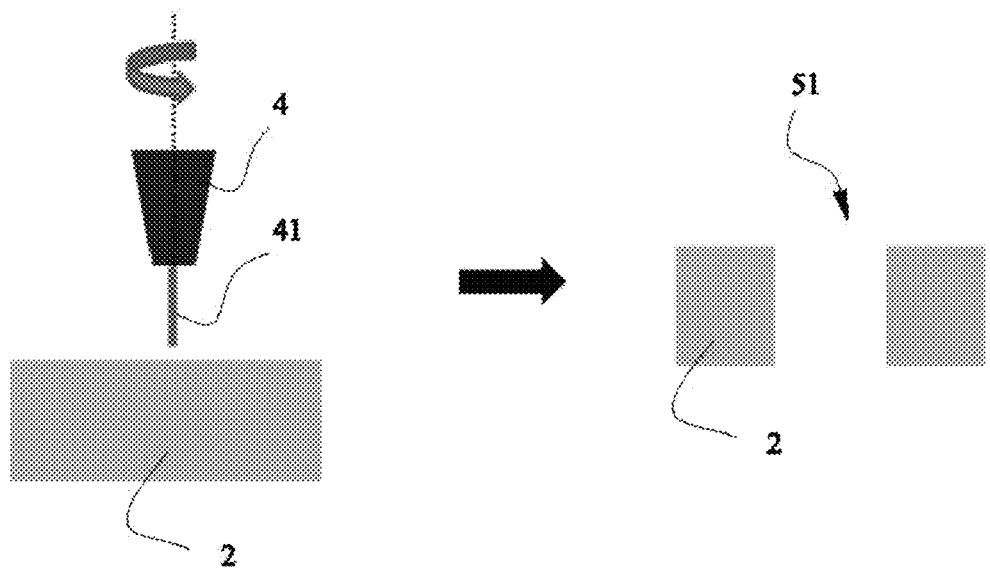

FIG. 3

```
┌─────────────────────────────────────────────────────┐
│ Fix, after stretching and aligning a blocking, the  │──── S401
│ blocking on a side of a frame                       │
└─────────────────────────────────────────────────────┘
                         │
                         ▼
┌─────────────────────────────────────────────────────┐
│ Open at least one stretching align hole and at least one │──── S402
│ evaporation align mark in the fixed blocking and frame │
└─────────────────────────────────────────────────────┘
                         │
                         ▼
┌─────────────────────────────────────────────────────┐
│ Fix, after stretching and aligning a mask sheet, the │
│ mask sheet on a side of the blocking away from the  │──── S403
│ frame according to the stretching align hole        │
└─────────────────────────────────────────────────────┘
                         │
                         ▼
┌─────────────────────────────────────────────────────┐
│ Open at least one evaporation align mark in the fixed │──── S404
│ mask sheet to obtain the mask assembly              │
└─────────────────────────────────────────────────────┘
```

FIG. 4

PREPARATION METHOD OF MASK ASSEMBLY AND MASK ASSEMBLY

CROSS REFERENCE TO RELATED APPLICATION

This application is a National Phase Application filed under 35 U.S.C. 371 as a national stage of PCT/CN2020/076946, filed on Feb. 27, 2020, an application claiming the priority of the Chinese patent application No. 201910229501.X, filed on Mar. 25, 2019, the contents of which are incorporated herein by reference in their entirety.

TECHNICAL FIELD

The present application relates to the technical field of evaporation, and particularly relates to a preparation method of a mask assembly and a mask assembly.

BACKGROUND

In the production of display panels, a mask assembly is needed to implement evaporation of a luminescent material. To ensure precise assembly of the mask assembly and an accurate evaporation position, a variety of holes for achieving different functions are often provided on the components constituting the mask assembly. However, misalignment of align holes is likely to cause low alignment accuracy between a substrate and the mask assembly when the mask assembly is used for evaporation.

SUMMARY

In a first aspect, an embodiment of the present application provides a preparation method of a mask assembly, including: fixing, after stretching and aligning a blocking, the blocking on a side of a frame; opening at least one stretching align hole and at least one evaporation align mark in the fixed blocking and frame; fixing, after stretching and aligning a mask sheet, the mask sheet on a side of the blocking away from the frame according to the stretching align hole; and opening at least one evaporation align mark in the fixed mask sheet to obtain the mask assembly.

In a second aspect, an embodiment of the present application provides a preparation method of a mask assembly, including: fixing, after stretching and aligning a blocking, the blocking on a side of the frame; fixing, after stretching and aligning a mask sheet, the mask sheet on a side of the blocking away from the frame; and opening at least one evaporation align mark in at least one of the fixed frame, blocking and mask sheet to obtain the mask assembly.

In a third aspect, an embodiment of the present application provides a mask assembly, including: a frame, a blocking and a mask sheet; the frame and the mask sheet being respectively disposed on two sides of and fixedly connected to the blocking; wherein the mask assembly is obtain by a preparation method as described above.

BRIEF DESCRIPTION OF THE DRAWINGS

The above and/or additional aspects and advantages of the present application will become apparent and readily understood from the description of embodiments with reference to the drawings below, in which:

FIG. 3 is a schematic diagram illustrating laser ablation in a preparation method of a mask assembly provided by an embodiment of the present application;

FIG. 4 is a schematic flowchart of a preparation method of a mask assembly provided by an embodiment of the present application;

DETAILED DESCRIPTION OF THE EMBODIMENTS

Figure 1:
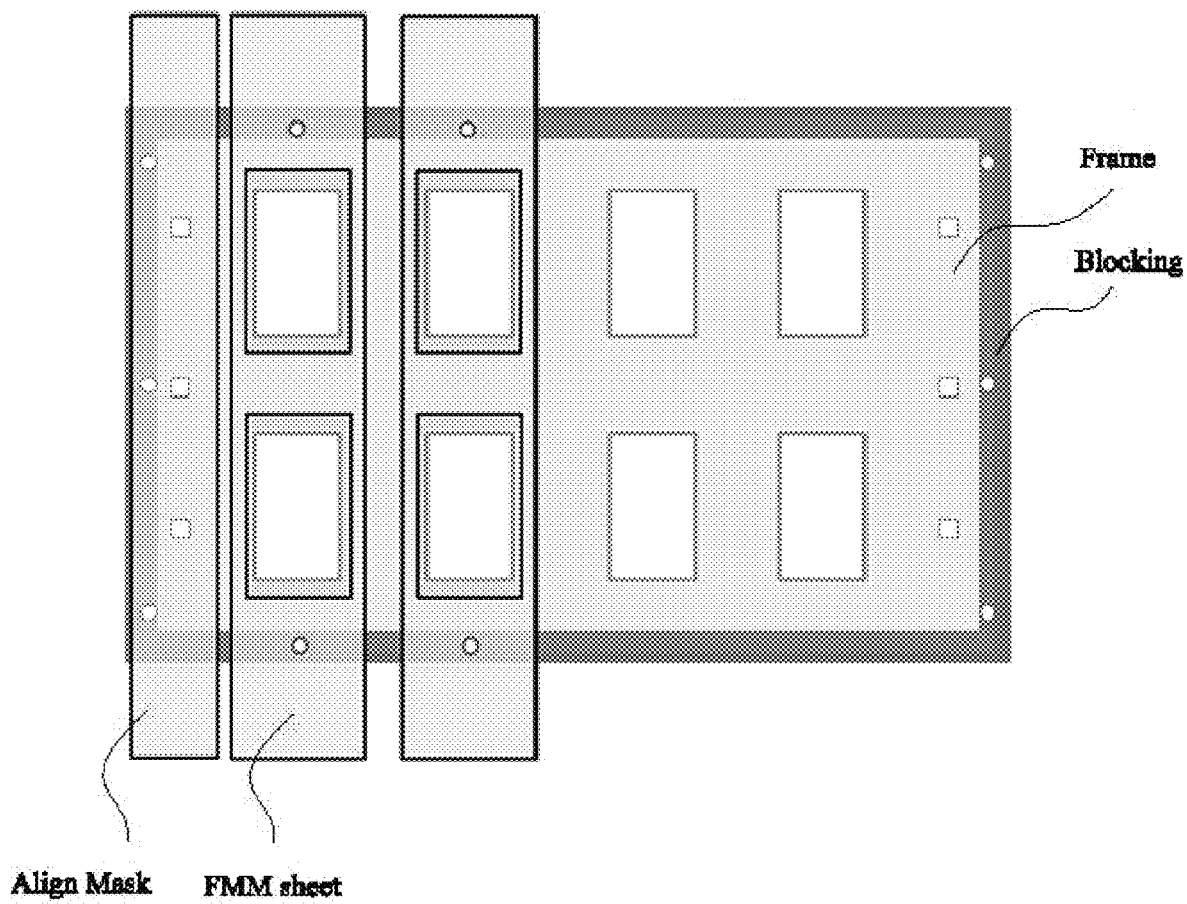
FIG. 1 is a structural schematic diagram of a mask assembly.

The present application will now be described in detail below, and examples embodiments of the present application will be shown in the drawings throughout which, the same or similar reference signs refer to the same or similar components or components with the same or similar functions. In addition, a detailed description of the known art is omitted if it is unnecessary for the shown features of the present application. The embodiments described below with reference to the drawings are merely illustrative, and are used only for the purpose of explaining the present application and should not be interpreted as limitations to the present application.

It will be understood by those skilled in the art that, unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the prior art and will not be interpreted in an idealized or overly formal sense unless expressly so defined herein.

Those skilled in the art will understand that as used herein, the singular forms "a", "an", "the" and "said" are intended to include the plural forms as well, unless expressly stated otherwise. It will be further understood that as used herein, the terms "comprises" and/or "comprising" specify the presence of stated features, integers, steps, operations, elements and/or components, but do not preclude the presence or addition of one or more other features, integers, steps, operations, elements, components, and/or groups thereof. As used herein, the term "and/or" includes all or any element and all combinations of one or more of the associated listed items.

As shown in FIG. 1, a mask assembly includes a frame, a blocking, an align mask and a fine metal mask sheet (FMM sheet). Processing of align marks such as align holes and detection mark openings in the frame, the blocking, the align mask and the FMM sheet are completed at the production stage. Afterwards, the blocking is stretched and aligned to be welded onto the frame according to the align marks in the blocking and the frame; and the align mask and the FMM sheet are respectively stretched and aligned to be welded onto the blocking according to the align holes in the align mask and the FMM sheet, so as to obtain the existing mask assembly.

However, the stretching and alignment operations on the blocking will affect the shape and position of the align mark thereon; and applying the deformed or deviated align hole to the subsequent stretching of the align mask and the FMM sheet will affect control of the stretching degree and the accuracy of alignment, resulting in deformation or position deviation of the align marks in the entire mask assembly, which is likely to cause low alignment accuracy between the substrate and the mask assembly when the mask assembly is used for evaporation.

As shown in FIG. 1, during preparation of the mask assembly, processing of align marks such as align holes and detection mark openings in the frame, the blocking, the align mask and the fine metal mask (FMM) sheet that constitute the mask assembly are completed at the production stage. After the processing of each align mark is completed, the blocking is stretched, aligned, and welded to the frame. At this time, the align marks provided on the blocking under the effect of stretching, such as a stretching align hole to determine a position and a stretching degree of the fine mask sheet, have undergone a certain degree of deformation and position deviation. After that, the fine mask sheet will inevitably be affected when being stretched and positioned by the deformed stretching align hole. In addition, deformation and position deviation of the detection mark opening in the fine mask sheet is inevitable during the stretching and alignment of the fine mask sheet, thereby affecting the accuracy of evaporation.

Most of the fine mask sheets are strip-shaped and are prone to deformation. A plurality of strip-shaped fine mask sheets are arranged together to define a position of a sub-pixel opening. In order to determine an assembly position of the fine mask sheet and for alignment of the plurality of strip-shaped fine mask sheets, an align mask is often used as an aid. Since the align mask itself is narrow and has many openings thereon, liquid medicine is easy to remain, making it difficult to clean. After being heated in the evaporation process, there is a difference between the expansion of the align mask and the expansion of the fine mask sheet and the blocking. Then, after alignment is performed by the align hole on the align mask, an error is formed at the sub-pixel opening position in an effective display area (area AA), finally leading to a deviation in evaporation. In addition, the stretching and alignment operations on the align mask will also affect the shape and position of the align mark thereon, and thus affect precision of the stretching and alignment operations on the fine mask sheet. Repeated stretching operations will cause accumulation of deformation errors, which will seriously affect components later assembled. Likewise, repeated stretching operations may also cause deformation and position changes of the align hole and the detection mark opening, which in turn affects the evaporation quality. The align mask, as a key component that assists to implement the evaporation effect on the fine mask sheet, has many align marks thereon. Thus, dirt accumulated in the holes is not easy to clean thoroughly, leading to a risk of polluting sub-pixels. Further, there is a certain deformation stress in the stretched align mask. In a high-temperature evaporation environment, the deformation degree is different from that of the effective display area (AA area), which will affect the evaporation quality.

The preparation method of a mask assembly provided by the present application aims to solve the above technical problems.

The following describes the technical solution of the present application and how to solve the above technical problems in detail by specific embodiments. The following specific embodiments may be combined with each other, and the same or similar concepts or processes may not be repeated in some embodiments. Hereinafter, embodiments of the present application will be described with reference to the accompanying drawings.

In an embodiment of the present application, there is provided a preparation method of a mask assembly which, as shown in FIG. 4, includes the following steps S401 to S404.

At S401: after stretching and aligning a blocking, the blocking is fixed on a side of a frame.

At S402: at least one stretching align hole and at least one evaporation align mark are opened in the fixed blocking and frame.

Optionally, the evaporation align mark includes at least one of an evaporation align hole and a detection mark opening.

Optionally, the step of opening at least one stretching align hole and at least one evaporation align mark in the fixed blocking and frame includes:

forming at least one stretching align hole, at least one evaporation align hole, and at least one first detection mark opening by laser cutting in the fixed blocking; and forming at least one evaporation align hole by laser cutting in the fixed frame.

At S403: after stretching and aligning a mask sheet, the mask sheet is fixed on a side of the blocking away from the frame according to the stretching align hole.

At S404: at least one evaporation align mark is opened in the fixed mask sheet to obtain the mask assembly.

Figure 5:
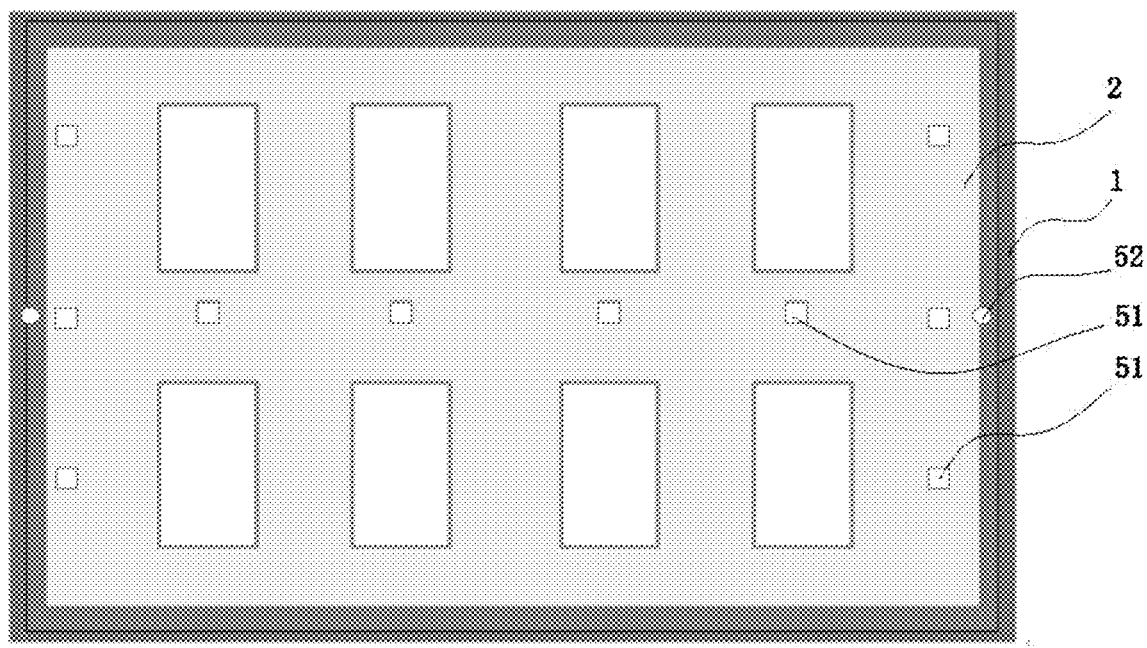
FIG. 5 is a structural schematic diagram illustrating part of the prepared mask assembly after opening align marks in the fixed blocking and frame according to a preparation method of a mask assembly provided by an embodiment of the present application.
Figure 6:
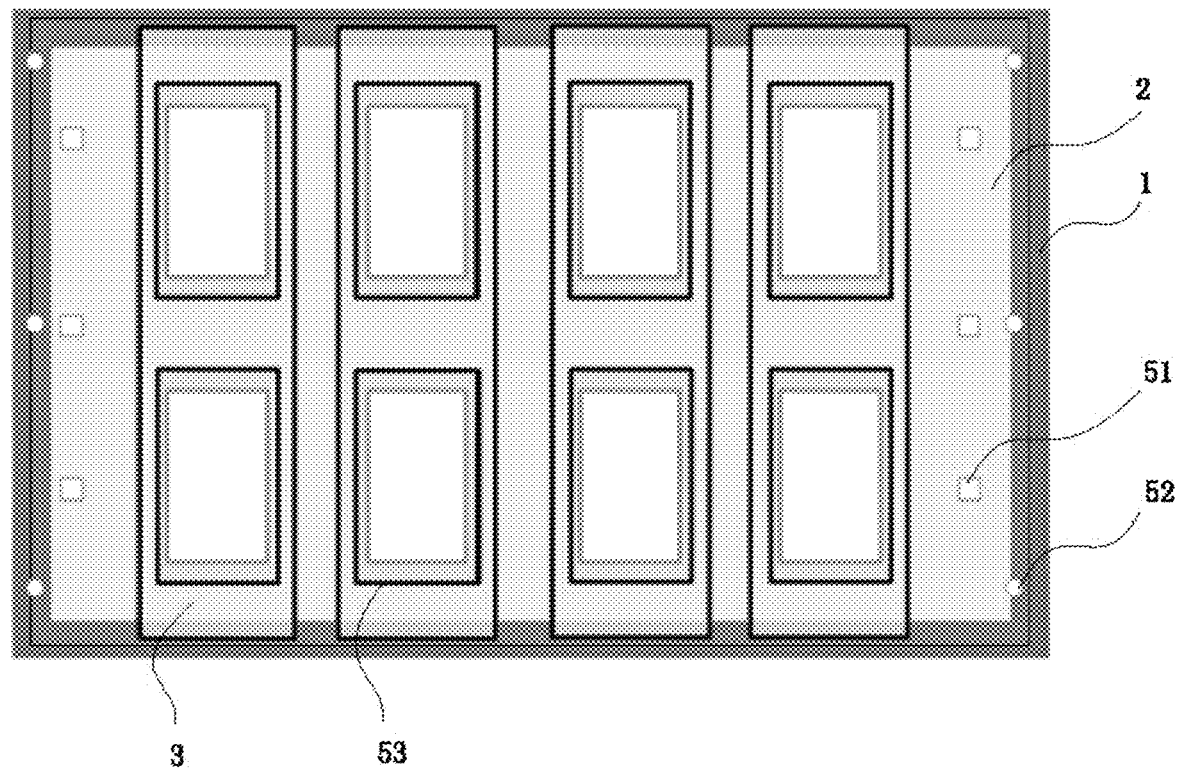
FIG. 6 is a structural schematic diagram of part of the prepared mask assembly after the mask sheet is fixed according to a preparation method of a mask assembly provided by an embodiment of the present application.
Figure 7:
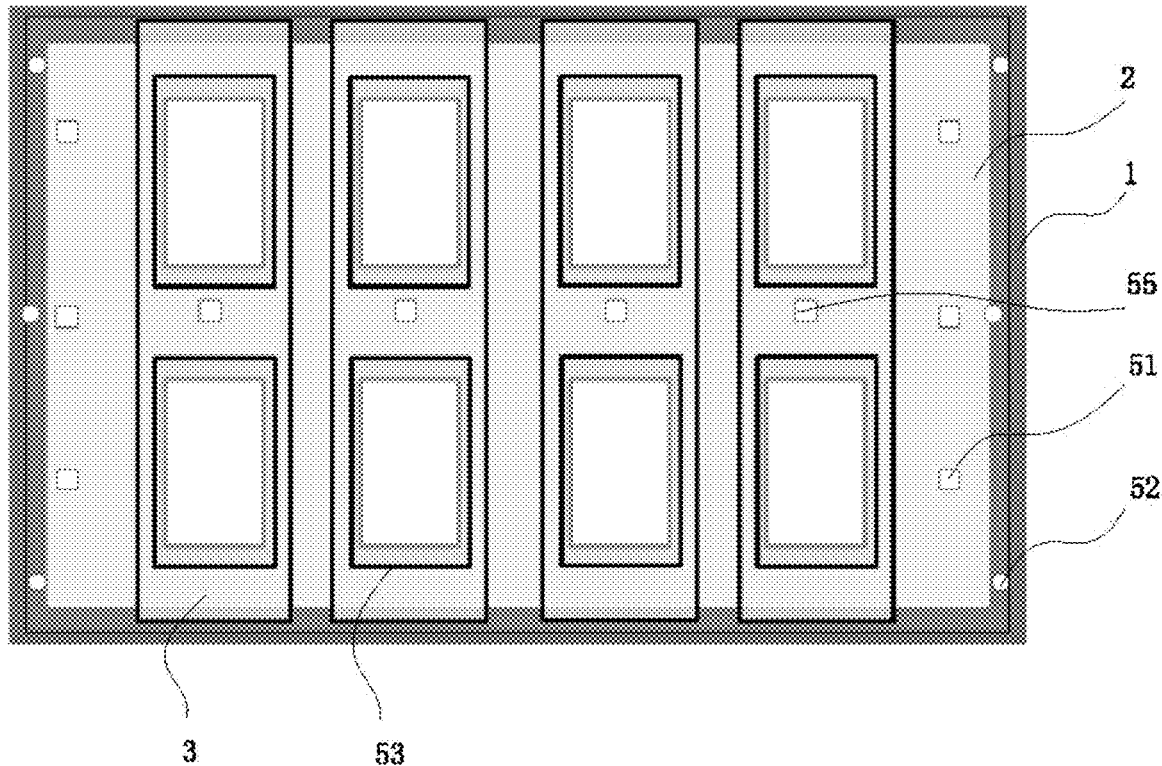
FIG. 7 is a structural schematic diagram illustrating part of the prepared mask assembly after opening an align mark in the fixed mask sheet according to a preparation method of a mask assembly provided by an embodiment of the present application.

Optionally, the step of opening at least one evaporation align mark in the fixed mask sheet includes:

forming at least one second detection mark opening in the fixed mask sheet by laser cutting at a position corresponding to the first detection mark opening. For example, as shown in FIG. 6, in the preparation method of a mask assembly described in the embodiments of the present application, the obtained evaporation align hole 52 may be provided at four corners of a connection portion of the frame 1 and the blocking 2, or may be distributed along a circumferential direction of the connection portion of the frame 1 and the shield 2. As shown in FIGS. 5 to 7, a first detection mark opening 51 may be disposed in the blocking 2 between openings corresponding to sub-pixel openings 53 in the mask sheet 3, or may be disposed in the blocking 2 corresponding to a portion between the sub-pixel opening 53 and the frame 1. As shown in FIG. 7, a second detection mark opening 55 may be disposed between at least part of the sub-pixel openings 53 in a row direction or a column direction in which the sub-pixels are arranged.

The following is an exemplary introduction to the preparation process of a mask assembly provided by the embodiments of the present application with reference to some steps in the preparation method of a mask assembly shown in FIG. 4 and the structure of the partial mask assembly shown in FIGS. 5 to 7:

(1) Assembling the Blocking and the Frame

Specifically, after stretching and aligning a blocking 2, the blocking 2 is fixed on a side of a frame 1. The purpose of this step is to assemble the blocking 2 and the frame 1 into one. The frame 1 is configured to provide circumferential support and positioning in the mask assembly. The blocking 2 is configured to shield at least part of a non-evaporation area in the evaporation process, so as to prevent an evaporation material from adhering to positions other than those corresponding to the sub-pixels. The blocking 2 and the frame 1 may be fixed by welding. The operation of assembling the blocking 2 and the frame 1 may be performed through original align marks preset on the blocking 2 and the frame 1. At least part of the original align marks on the frame 1 is matched in position with at least part of the original align marks on the blocking 2.

When the relative positional relationship between the original align marks on the blocking 2 and the original align marks on the frame 1 is within a reasonable range, such as overlapping, it is determined that the stretching and alignment of the blocking 2 is completed. For example, a user or a stretching device may determine a stretching degree of the blocking 2 and the relative positional relationship between the frame 1 and the blocking 2 according to at least part of the original align marks on the frame 1 and at least part of the original align marks on the blocking 2.

The original align marks may be provided at an overlap portion of the blocking 2 and the frame 1. The overlap portion is the darker portion where the blocking 2 is adjacent to the frame 1 in the structure of the partial mask assembly shown in FIGS. 5-7 and 9. The colour difference at the position where the blocking 2 is adjacent to the frame 1 shown in FIGS. 5-7 and 9 is a schematic diagram of the overlap portion of the blocking 2 and the frame 1. The blocking 2 may be made of a partially transparent material, and has a colour difference on a side away from the frame 1 relative to the overlap portion with the frame 1; or the blocking 2 may be made of an opaque material, and has no colour difference on the side away from the frame 1 relative to the overlap portion with the frame 1. A plurality of original align marks may be provided. The original align marks on the frame 1 and the original align marks on the blocking 2 may have a hole shape. After determining the relative position of the frame 1 and the blocking 2, the frame 1 and the blocking 2 are fixed together.

By this method, before assembling the frame 1 and the blocking 2 together, it is only necessary to make original align marks that can meet the alignment requirements. For example, since no evaporation align hole or detection mark opening is made in this step, the stretching herein will not cause changes in the shape, size and position of the evaporation align hole or the detection mark opening.

(2) Providing Part of the Align Marks on the Assembled Blocking and Frame

Specifically, as shown in FIG. 5, at least one stretching align hole and at least one evaporation align mark are opened in the fixed blocking 2 and frame 1. The stretching align hole opened in this step is used for stretching and alignment operations on the mask sheet in subsequent processes. The evaporation align mark is used for alignment, evaporation position detection or evaporation position deviation detection in the subsequent evaporation process. At least part of the stretching align holes and the evaporation align marks may have a hole-like structure. When a plurality of stretching align holes and a plurality of evaporation align marks are provided, parts with the same function may be provided only on the blocking 2 or only on the frame 1; and when a plurality of stretching align holes and a plurality of evaporation align marks are provided, parts with the same function may also be provided on the blocking 2 and the frame 1, respectively.

Figure 2:
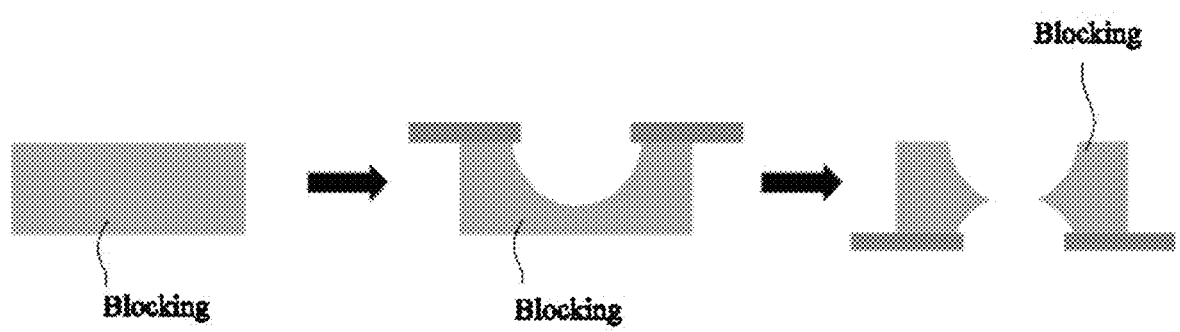
FIG. 2 is a schematic diagram illustrating a preparation method of various holes in the mask assembly.

FIG. 2 shows a process of forming an original align mark. Taking an align hole on the blocking as an example, a photoresist material is first coated on the blocking, and then part of the photoresist material corresponding to a position of the original align mark is removed to form a photoresist material notch. The blocking is etched on the side coated with the photoresist material, and a groove is formed on one side of the blocking facing the photoresist material corresponding to a position of the photoresist material notch. Secondly, another groove is formed on the other side of the blocking at the position corresponding to the original align mark in the same manner, and the grooves on two sides of the blocking are communicated to each other to form the original align mark.

In the preparation method of a mask assembly described in the embodiments of the present application, at least part of the stretching align holes and the evaporation align marks are prepared by a laser cutting process. Specifically, taking the first detection mark opening 51 on the blocking 2 as an example, as shown in FIG. 3, cutting operations on raw materials of different thicknesses are performed by a laser emitter 4 exciting laser light 41 of different wavelengths and intensities. Laser cutting has a narrow cutting area and high cutting quality, resulting in a small affected area and small deformation of the raw material caused by cutting. Laser cutting also has the advantages of high efficiency and fast speed, which can ensure dimensional accuracy, shape accuracy and position accuracy of the align mark to a large extent. The laser cutting process is also applicable to the production of other align marks such as the evaporation align hole 52 and the second detection mark opening 55 involved in the embodiments of the present application.

(3) Assembling the Mask Sheet

As shown in FIG. 6, after stretching and aligning a mask sheet 3, the mask sheet is fixed on a side of the blocking 2 away from the frame 1 according to the stretching align hole. In this step, the stretching and alignment operations on the mask sheet 3 may be completed by a stretching device. After determining the stretching degree of the mask sheet 3 and the relative position between the mask sheet 3 and the frame 1, the mask sheet 3 may be fixed on a side of the blocking 2 away from the frame 1 by welding so that the blocking 2 is disposed between the frame 1 and the mask sheet 3. This step directly establishes a matching relationship between the mask sheet 3 and the blocking 2 without using an align mask, thereby reducing the difficulty in preparing the mask assembly.

In each mask assembly, at least one mask sheet is provided. In the step of assembling the mask sheet, a plurality of mask sheets may be assembled sequentially.

(4) Providing Part of the Align Marks on the Assembled Mask Sheet

At least one evaporation align mark is opened in the fixed mask sheet 3 to obtain the mask assembly. The evaporation align mark in the step is used for alignment, evaporation position detection and evaporation position deviation detection in the subsequent evaporation process. When the evaporation align marks may be divided into multiple types according to their functions, at least one of the multiple types of evaporation align marks may be opened on the mask sheet 3. In an alternative embodiment of the present application, after the step of assembling the mask sheet 3, at least one evaporation align mark may be provided on the frame 1.

The evaporation align mark may include multiple types of marks with different functions. In an alternative embodiment of the present application, the evaporation align mark includes: at least one of an evaporation align hole and a detection mark opening. As shown in FIG. 6, the evaporation align hole 52 is configured to determine an evaporation position during the evaporation process. The detection mark opening is used for alignment, evaporation position detection and evaporation position deviation detection in the subsequent evaporation process. The plurality of evaporation align holes 52 and the plurality of detection mark openings are formed after the blocking 2 is stretched and positioned, so as to prevent the stretching of the blocking 2 from affecting the quality of the evaporation align holes 52 and the detection mark openings. In addition, with the method described in the embodiments of the present application, the evaporation align hole 52 and the detection mark opening maintain their original shapes to a large extent, and under an influence of high temperature in the subsequent evaporation process, the evaporation align hole 52 and the detection mark opening can have a deformation degree conforming to a deformation degree of the operation area (area AA).

Optionally, the step of opening at least one stretching align hole and at least one evaporation align mark in the fixed blocking 2 and frame 1 includes: forming at least one stretching align hole, at least one evaporation align hole, and at least one first detection mark opening 51 by laser cutting in the fixed blocking 2; and forming at least one evaporation align hole 52 by laser cutting in the fixed frame 1.

The order in which the stretching align hole and the evaporation align mark are opened in the blocking is not limited herein, and can be adjusted according to the actual process environment. The order in which the align mark is opened in the blocking 2 and the align mark is opened in the frame 1 is not limited. The first detection mark opening 51 has at least part of an evaporation position deviation for the evaporation process. In addition, the first detection mark opening 51 is also configured to assist in forming a second detection mark opening on the mask sheet 3 in a subsequent step.

At least one of the stretching align holes is opened by laser cutting, and at least one of the evaporation align marks is opened by laser cutting. Cutting operations on raw materials of different thicknesses are performed by a laser emitter exciting laser light of different wavelengths and intensities. The raw material may be at least one of the blocking, the frame and the mask sheet in the embodiments of the present application. Laser cutting has a narrow cutting area and high cutting quality, resulting in a small affected area and small deformation of the raw material caused by cutting. Laser cutting also has the advantages of high efficiency and fast speed, which can ensure dimensional accuracy, shape accuracy and position accuracy of the align mark to a large extent.

The step of opening at least one evaporation align mark in the fixed mask sheet 3 includes: forming at least one second detection mark opening 55 in the fixed mask sheet 3 by laser cutting, the second detection mark opening 55 being provided corresponding to the first detection mark opening 51. The second detection mark opening 55 is configured to detect an evaporation position deviation in the evaporation process, and is positioning by the first detection mark opening 51.

Figure 8:
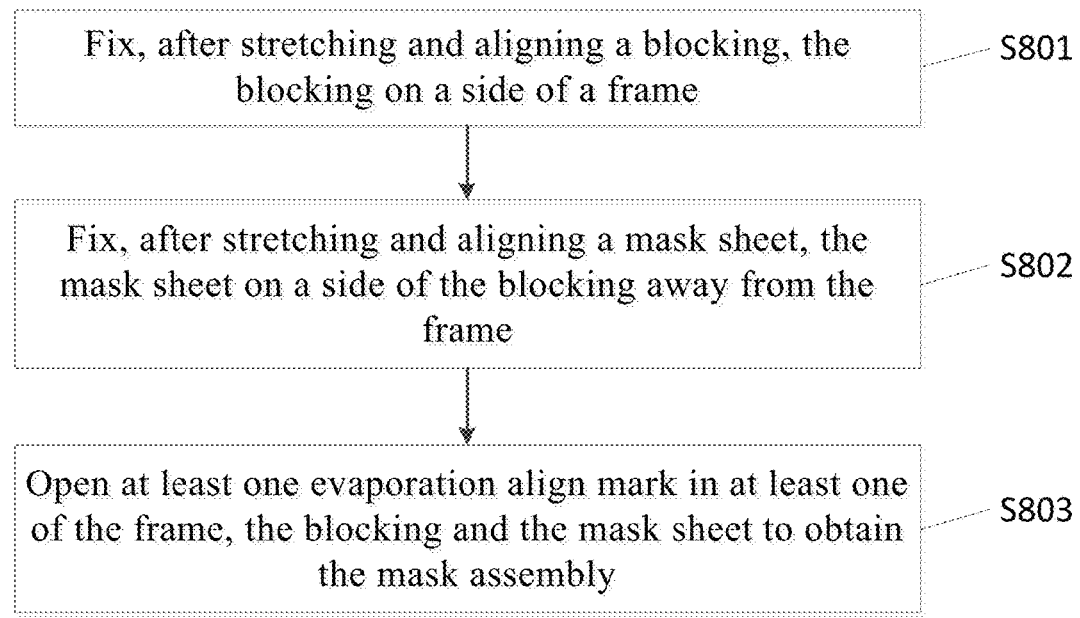
FIG. 8 is a schematic flowchart of another preparation method of a mask assembly provided by an embodiment of the present application.

Based on the same inventive concept, an embodiment of the present application provides another preparation method of a mask assembly. FIG. 8 shows a schematic flowchart of the preparation method, which includes the following steps S801 to S803.

At S801: after stretching and aligning a blocking, the blocking is fixed on a side of a frame.

At S802: after stretching and aligning a mask sheet, the mask sheet is fixed on a side of the blocking away from the frame.

At S803: at least one evaporation align mark is opened in at least one of the fixed frame, blocking and mask sheet to obtain the mask assembly.

Optionally, the align mark includes at least one of an evaporation align hole and a detection mark opening.

Optionally, the step of opening at least one evaporation align mark in at least one of the frame, the blocking and the mask sheet includes:

forming at least one detection mark opening by laser cutting in the fixed mask sheet; and forming at least one evaporation align hole by laser cutting in the fixed blocking and/or frame.

Figure 9:
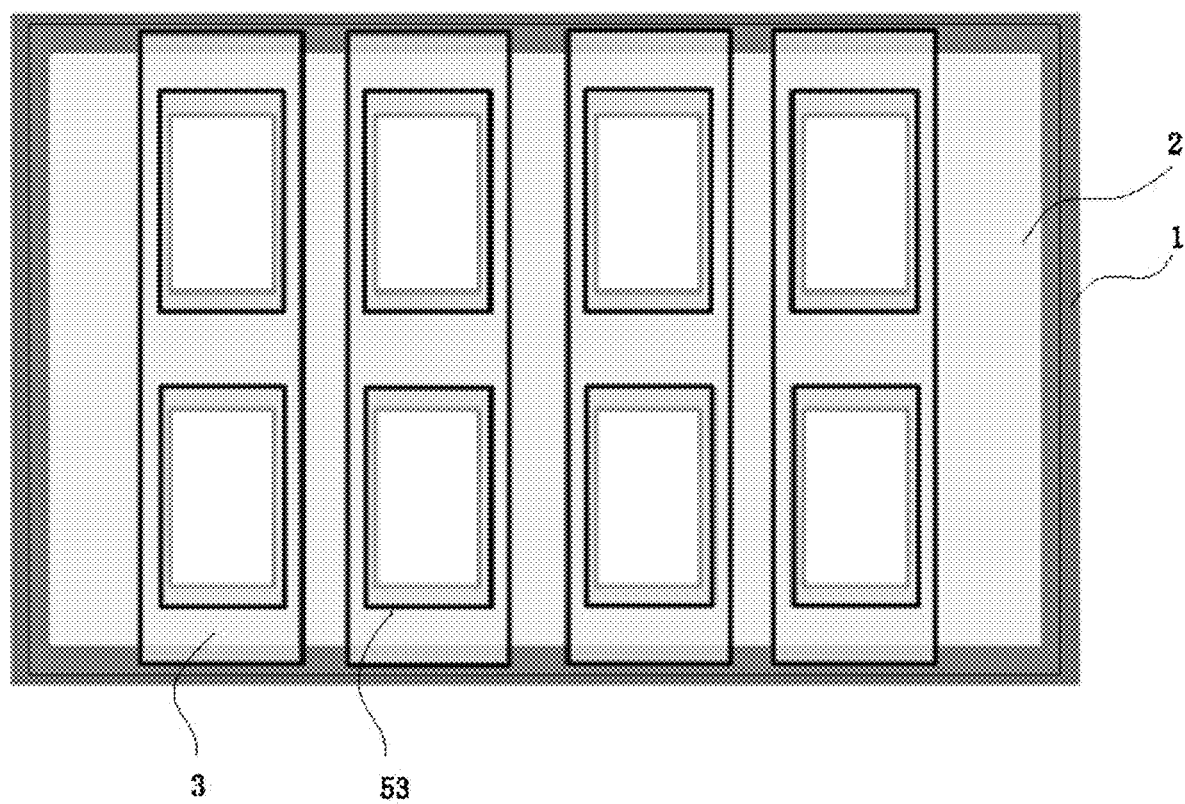
FIG. 9 is a structural schematic diagram of part of the prepared mask assembly after the mask sheet is fixed according to another preparation method of a mask assembly provided by an embodiment of the present application.

The following is a specific introduction of the preparation method of a mask assembly provided by the embodiments of the present application with reference to some steps in the preparation method of a mask assembly shown in FIG. 8 and the structure of the partial mask assembly shown in FIG. 9:

(1) Assembling the Frame, the Blocking and the Mask Sheet

As shown in FIG. 9, after stretching and aligning, the mask sheet 3 is fixed on a side of the blocking 2 away from the frame 1. The frame 1 is configured to provide circumferential support and positioning in the mask assembly. The blocking 2 is configured to shield at least part of a non-evaporation area in the evaporation process, so as to prevent an evaporation material from adhering to positions other than those corresponding to the sub-pixel openings 53. The mask sheet 3 is configured to define positions and shapes of the sub-pixels. At least one of the fixation manners between the blocking 2 and the frame 1 and between the mask sheet 3 and the blocking 2 may be welding.

The operation of assembling the blocking 2 and the frame 1 may be performed through original align marks preset on the blocking 2 and the frame 1. When the relative positional relationship between the original align marks on the blocking 2 and the original align marks on the frame 1 is within a reasonable range, such as overlapping, it is determined that the stretching and alignment of the blocking 2 is completed. The alignment between the blocking 2 and the mask sheet 3 may also be performed through original align marks preset on the blocking 2 and the mask sheet 3. When the relative positional relationship between the original align marks on the blocking 2 and the original align marks on the mask sheet 3 is within a reasonable range, such as overlapping, it is determined that the stretching and alignment of the mask sheet 3 is completed. The original align marks used for assembling the frame 1 and the blocking 2 may be provided at an overlap portion of the blocking 2 and the frame 1. The original align marks used for stretching and aligning the mask sheet 3 may be provided at an overlap portion of the blocking 2 and the mask sheet 3. A plurality of original align marks may be provided. The original align marks on the frame 1 and the original align marks on the blocking 2 may have a hole shape.

In each mask assembly, at least one mask sheet is provided. In the step of assembling the mask sheet, a plurality of mask sheets may be assembled sequentially.

(2) Providing at Least Part of the Align Marks on the Assembled Blocking, Frame and Mask Sheet At least one evaporation align mark is opened in at least one of the fixed frame 1, blocking 2 and mask sheet 3 to obtain the mask assembly. Here, the fixed frame, blocking and mask sheet mean that the three are assembled. The evaporation align mark is used for alignment or evaporation position detection in the subsequent evaporation process. The evaporation align mark may have a hole-like structure. Among the plurality of evaporation align marks, parts with the same function may be provided only on the blocking 2, or only on the frame 1, or only on the mask sheet 3. Among the plurality of evaporation align marks, parts with the same function may be provided on the blocking 2, the frame 1, and the mask sheet 3, respectively.

The evaporation align mark may include multiple types of marks with different functions. In an alternative embodiment of the present application, the evaporation align mark includes: at least one of an evaporation align hole and a detection mark opening. The evaporation align hole is configured to determine an evaporation position during the evaporation process. The detection mark opening is used for alignment, evaporation position detection and evaporation position deviation detection in the subsequent evaporation process.

The step of opening at least one evaporation align mark in at least one of the frame 1, the blocking 2 and the mask sheet 3 includes: forming at least one detection mark opening by laser cutting in the fixed mask sheet 3; forming at least one evaporation align hole by laser cutting in at least one of the fixed blocking 2 and frame 1.

The order in which the evaporation align hole is opened in at least one of the blocking 2 and the frame 1 and the detection mark opening is opened in the mask sheet 3 is not limited herein, and can be adjusted according to the actual process environment. At least one of the evaporation align marks is opened by laser cutting. Cutting operations on raw materials of different thicknesses are performed by a laser emitter exciting laser light of different wavelengths and intensities. Laser cutting has a narrow cutting area and high cutting quality, resulting in a small affected area and small deformation of the raw material caused by cutting. Laser cutting also has the advantages of high efficiency and fast speed, which can ensure dimensional accuracy, shape accuracy and position accuracy of the align mark to a large extent.

Based on the same inventive concept, an embodiment of the present application provides a mask assembly that can be obtained by the preparation method of a mask assembly according to the embodiments of the present application. The mask assembly provided by the embodiment of the present application includes:

a frame, a blocking and a mask sheet;

the frame and the mask sheet being respectively disposed on two sides of and fixedly connected to the blocking.

Optionally, at least one evaporation align mark is opened in the frame, the blocking and the mask sheet, respectively, and a stretching align hole is opened in the blocking. Optionally, the mask assembly in the embodiment of the present application is specifically a fine metal mask (FMM) assembly. In each mask assembly, at least one mask sheet is provided.

Optionally, the evaporation align mark of the mask assembly provided in the embodiment of the present application includes at least one of an evaporation align hole and a detection mark opening.

Optionally, the mask assembly provided in the embodiments of the present application includes at least one of:

at least one of the stretching align hole and the evaporation align mark obtained by laser cutting; and the mask sheet being a fine metal mask (FMM) sheet.

The mask assembly provided by the embodiments of the present application has the same inventive concept and the same beneficial effects as the previous embodiments. For the contents about the mask assembly that are not shown in detail, please refer to the previous embodiments, which will not be repeated here.

By applying the preparation method of a mask assembly and the mask assembly provided in the embodiments of the present application, at least the following beneficial effects can be achieved:

1) In the preparation method of a mask assembly described in the embodiments of the present application, the blocking is firstly stretched and disposed on the frame, and then evaporation align marks are opened in the blocking and the frame so that the evaporation align holes in the blocking and the frame are not affected by the stretching operation during installation of the blocking. Moreover, the evaporation align mark in the mask sheet is opened after the mask sheet is stretched and fixed on the blocking so that the evaporation align mark in the mask sheet is not affected by the stretching and other operations during installation of the mask sheet. Thereby, the probability or degree of deformation or displacement of the evaporation align hole in the mask assembly of the present application is greatly reduced, the original shape of the evaporation align hole is maintained to a large extent, which is conducive to improving the accuracy of mask sheet alignment and the accuracy of evaporation.

2) In the mask assembly of the embodiments of the present application, the align mask is omitted. Thus, the structure and preparation process of the mask assembly are simplified, which is beneficial to reduce costs.

Those skilled in the art will understand that various operations, methods, steps in the flow, measures, solutions discussed in this application can be alternated, modified, combined, or deleted. Further, various operations, methods, other steps in the flow, measures, solutions that have been specifically discussed in this application may be alternated, modified, rearranged, decomposed, combined, or deleted. Further, various operations, methods, other steps in the flow, measures, solutions that have been specifically discussed in this application in the related art may be alternated, modified, rearranged, decomposed, combined, or deleted.

The terms "first", "second" are used for the purpose of illustration only and are not to be construed as indicating or implying a relative importance or implicitly indicating the number of the indicated technical features. Therefore, features defined by "first" or "second" may include one or more of the features either explicitly or implicitly. In the description of the present disclosure, "a plurality" means two or more unless otherwise specified.

It should be understood that although the steps in the flowchart of the drawings are displayed in an order indicated by the arrows, the steps are not necessarily executed in the order indicated by the arrows. Unless otherwise explicitly stated herein, these steps are not strictly executed in a limited order, but can be executed in other orders. Moreover, at least part of the steps in the flowchart of the drawings may include multiple sub-steps or multiple stages. These sub-steps or stages are not necessarily executed at the same time, but may be executed at different times, and the order of execution is not necessarily carried out sequentially, but may be executed in turn or alternately with at least part of other steps or sub-steps or stages of other steps.

The foregoing are only part of the implementations of the present application, and it should be noted that modifications and refinements may be made by those skilled in the art without departing from the principles of the present application and these modifications and refinements should be considered as within the scope of the present application.

What is claimed is:

1. A preparation method of a mask assembly, comprising:
fixing, after stretching and aligning a blocking, the blocking on a side of a frame;
opening at least one stretching align hole and at least one evaporation align mark in the fixed blocking and frame;
fixing, after stretching and aligning a mask sheet, the mask sheet on a side of the blocking away from the frame according to the stretching align hole; and
opening at least one evaporation align mark in the fixed mask sheet to obtain the mask assembly.

2. The preparation method according to claim 1, wherein the evaporation align mark comprises at least one of an evaporation align hole and a detection mark opening.

3. The preparation method according to claim 2, wherein the step of opening at least one stretching align hole and at least one evaporation align mark in the fixed blocking and frame comprises:
forming at least one stretching align hole, at least one evaporation align hole, and at least one first detection mark opening by laser cutting in the fixed blocking; and
forming at least one evaporation align hole by laser cutting in the fixed frame.

4. The preparation method according to claim 3, wherein the step of opening at least one evaporation align mark in the fixed mask sheet comprises:
forming at least one second detection mark opening in the fixed mask sheet by laser cutting at a position corresponding to the first detection mark opening.

5. A preparation method of a mask assembly, comprising:
fixing, after stretching and aligning a blocking, the blocking on a side of the frame;
fixing, after stretching and aligning a mask sheet, the mask sheet on a side of the blocking away from the frame; and
opening at least one evaporation align mark in at least one of the fixed frame, blocking and mask sheet to obtain the mask assembly.

6. The preparation method according to claim 5, wherein the evaporation align mark comprises at least one of an evaporation align hole and a detection mark opening.

7. The preparation method according to claim 6, wherein the step of opening at least one evaporation align mark in at least one of the frame, the blocking and the mask sheet comprises:
forming at least one detection mark opening by laser cutting in the fixed mask sheet; and
forming at least one evaporation align hole by laser cutting in the fixed blocking and/or frame.

* * * * *